(12) United States Patent
Irwin et al.

(10) Patent No.: US 6,861,721 B1
(45) Date of Patent: Mar. 1, 2005

(54) BARRIER REGION AND METHOD FOR WAFER SCALE PACKAGE (WCSP) DEVICES

(75) Inventors: Mark A. Irwin, Tucson, AZ (US); Rodney T. Burt, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/730,701

(22) Filed: Dec. 8, 2003

(51) Int. Cl.⁷ .......................................... H01L 31/0232
(52) U.S. Cl. ...................................... 257/436; 257/437
(58) Field of Search .................. 257/461, 403, 257/436, 452, 437, 751, 35, 376

(56) References Cited

U.S. PATENT DOCUMENTS

| | | | | |
|---|---|---|---|---|
| 4,352,117 A | * | 9/1982 | Cuomo et al. ................. | 257/11 |
| 4,626,884 A | * | 12/1986 | Shannon ...................... | 257/452 |
| 5,485,015 A | * | 1/1996 | Choi ............................ | 257/21 |
| 5,650,337 A | * | 7/1997 | Cahen et al. ................. | 438/22 |
| 5,767,538 A | | 6/1998 | Mullins et al. .............. | 257/115 |
| 6,538,195 B1 | * | 3/2003 | Shi et al. ..................... | 136/259 |
| 2004/0119003 A1 | * | 6/2004 | Ikeda ......................... | 250/234 |

* cited by examiner

*Primary Examiner*—S. V. Clark
(74) *Attorney, Agent, or Firm*—W. Daniel Swayze, Jr.; W. James Brady; Frederick J. Telecky, Jr.

(57) ABSTRACT

A barrier region provided in the active surface of a wafer-level chip scale package device or chip (WCSP device or chip) to substantially reduce the amount of photon-generated substrate current that reaches active circuitry within the active area of the chip.

17 Claims, 3 Drawing Sheets

BARRIER REGION AND METHOD FOR WAFER SCALE PACKAGE (WCSP) DEVICES

BACKGROUND OF THE INVENTION

The present invention relates generally to "wafer-level chip scale package" (WCSP) devices in which integrated circuit chips are not surrounded by opaque packaging material, and more particularly to avoiding photon-induced currents to flow in the chip's substrate as a result of surfaces of the chips, especially the edges thereof, being exposed to light.

A WCSP device, also referred to herein as a WCSP chip, is sometimes exposed to light because the silicon chip is not surrounded by any opaque packaging material (such as opaque plastic or epoxy encapsulation material), and light impinging on the chip causes photon-induced currents to flow in the chip substrate. The photon-induced currents can undesirably increase the magnitudes of input bias currents of circuitry in the WCSP chip. (Those skilled in the art know that an ideal amplifier has infinitely high input impedance and zero input bias current. Therefore, reduced input bias current is desirable in many applications, for example to achieve low input offset voltages and/or to reduce output errors in feedback amplifiers.)

FIG. 1 shows a conventional WCSP chip 1 having solder bumps 3 on the active surface of the chip. As shown in FIG. 1, WCSP chip 1 is inverted, and solder bumps 3 are physically and electrically connected to various conductors 4 on a surface 5A of a mounting substrate 5, such as a printed circuit board. WCSP chip 1 includes a silicon substrate 2 having a back surface 2A with a light barrier coating 6 thereon. Arrow 7 indicates the general location of the "active region" 12 (see FIG. 2) of chip 1 within which integrated circuitry is formed. No packaging or encapsulation is provided directly around WCSP chip 1 to prevent ambient light from impinging upon it.

FIG. 2 illustrates ambient light rays impinging upon WCSP chip 1. Some of the ambient light 10A is reflected from light barrier coating 6, and has no effect on the operation of the circuitry in active region 12. However, other ambient rays such as 10C-1 impinge upon the exposed edges of WCSP chip 1 and enter silicon substrate 2, as indicated by reference numeral 10C-2. Other ambient light rays such as 10B strike the surface 5A of mounting substrate 5 and are reflected one or more times between surface 5A and the bottom surface of the inverted WCSP chip 1 as it appears in FIG. 2 and eventually strike the chip surface in area 7 wherein the active region 12 is located. FIG. 3 illustrates photon-induced currents caused by the ambient light striking exposed areas of chip 2.

Referring to FIG. 3, photon-induced currents 13 are caused by ambient light 10C, some of which is indicated as being reflected from a surface 5A of the mounting substrate near the exposed surfaces of chip 2. Nearly all of photon-induced current 13 is collected by circuitry at the edge of active region 12 of WCSP chip 2. For example, FIG. 4 illustrates an amplifier 15 included in circuitry 12A in active region 12 of FIG. 3. Amplifier 15 has two external inputs which are connected to corresponding solder bumps 3-1 and 3-2, respectively. Circuitry 12A also includes two input protection diodes 21 and 22 connected to the two input terminals that are connected to solder bumps 3-1 and 3-2, respectively. Reference numerals 13A and 13B designate large portions of the photon-induced current 13 in FIG. 3 being collected by input protection diodes 21 and 22, respectively. The total bias current flowing into terminal 3-1 is equal to the sum of the actual input bias current Iinput of the (−) input of amplifier 15 plus the photon current Ip collected by input protection diode 21. Similarly, the total bias current flowing into terminal 3-2 is equal to the sum of an actual input bias current Iinput of the (+) input of amplifier 15 plus a photon current Ip collected by input protection diode 22. Therefore, if the photon-induced currents Ip are very large, the total input bias current of amplifier 15, i.e., the total input bias current flowing through input solder bumps 3-1 and 3-2, which also function as the input terminals of amplifier 15, also will be very large. For example, if chip 20 is not exposed to any light, the total input bias current flowing into input terminals 3-1 and 3-2 may be typically about 2 picoamperes. However, if chip 20 then is exposed to a typical amount of ambient room light, then the total input bias current flowing into input terminals 3-1 and 3-2 may be typically about 150 picoamperes.

Barrier rings of various types are widely used in integrated circuit devices and even in discrete transistors to collect various kinds of substrate currents to prevent such currents from degrading circuit performance or to prevent undesired circuit latching or other parasitic effects. For example, commonly owned U.S. Pat. No. 5,767,538 issued Jun. 16, 1988 to Mullins et al. discloses a doped barrier ring for preventing photon-induced currents caused by light impinging on an integrated photodiode included within an integrated circuit from reaching other circuitry included in the integrated circuit. However, use of barrier regions or rings can substantially increase the amount of chip area required for an integrated circuit without accomplishing a benefit that is worth the cost.

Thus, there is an unmet need for a device structure for a WCSP chip that avoids problems due to photon-induced substrate currents being collected by active circuitry in the chip.

There also is an unmet need for a WCSP chip device structure that prevents photon-induced substrate currents from substantially increasing the total input bias currents of active circuitry in the chip.

SUMMARY OF THE INVENTION

Accordingly, is an object of the invention to provide a device structure for a WCSP chip that prevents photon-induced substrate currents from reaching active circuitry in the device.

It is another object of the invention to provide a device structure for a WCSP chip that prevents photon-induced substrate currents from being combined with actual input bias currents to cause excessively large total input bias currents of active circuitry in the device.

Briefly described, and in accordance with one embodiment, the present invention provides a barrier region in the active surface of the WCSP chip to substantially reduce the amount of photon-generated substrate current in the substrate of the chip that reaches active circuitry within the core.

In one embodiment of the invention, the amount of photon-induced current in a semiconductor chip having a layer of light barrier material on its back surface is reduced by forming a peripheral barrier region (for example, an N-type region) in a substrate (for example, a P-type substrate) of the chip, wherein the N-type region is adjacent to or surrounds an active region (12) including integrated circuitry on a first surface of the substrate, and reverse biasing (or zero-biasing) a PN junction between the N-type region and the P-type substrate. In the described embodiment, the barrier region completely surrounds the integrated circuitry. A plurality of solder bumps are provided on the active surface and electrically coupled to various conductors of the integrated circuitry in the active region, respectively. The chip is adapted to be mounted on a mounting substrate by physically and electrically attaching the solder bumps to corresponding conductive metal pads on a surface of the mounting substrate. A substantial amount of photon-induced current caused by ambient light impinging on the exposed edges of the semiconductor substrate (20) is collected by means of the N-type barrier region (25) so that substantially less of the photon-induced current is available to be collected by any of the integrated circuitry. In the described embodiment, the integrated circuitry includes an amplifier (15) having a first input connected to both the cathode of the first input protection device (21) and a first input terminal connected to a first solder bump (16) and a second input connected to both the cathode of the second input protection device (22) and a second input terminal connected to a second solder bump (17), wherein the total input bias current of amplifier includes relatively little photon-induced current. The supply voltage conductor is coupled to the N-type barrier region by means of an N+ contact region on the N-type barrier region.

DETAILED DESCRIPTION OF THE PREFERRED EMBODIMENTS

Figure 1:
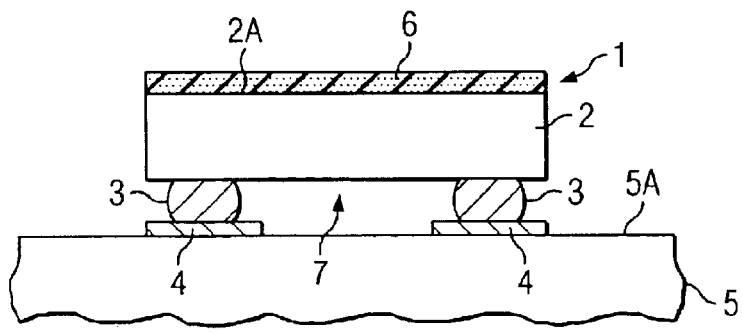
FIG. 1 is a section view a conventional WCSP chip having its solder bumps attached to conductors on a mounting substrate such as a printed circuit board.
Figure 2:
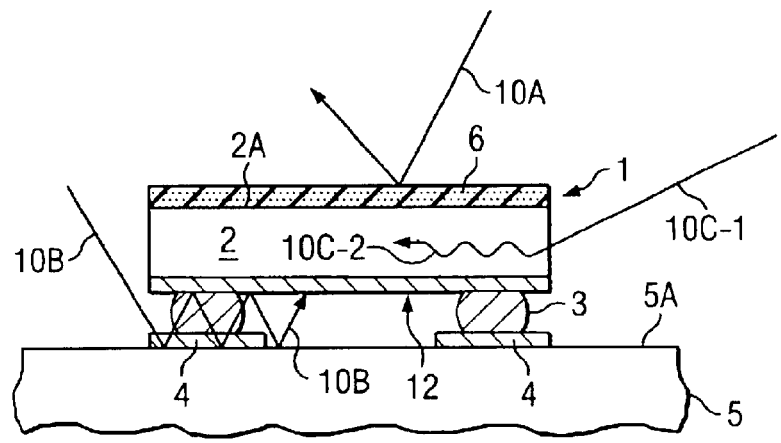
FIG. 2 shows the WCSP chip and mounting substrate of FIG. 1 and paths of ambient light rays which cause photon-induced currents that deleteriously affect the chip's performance.
Figure 3:
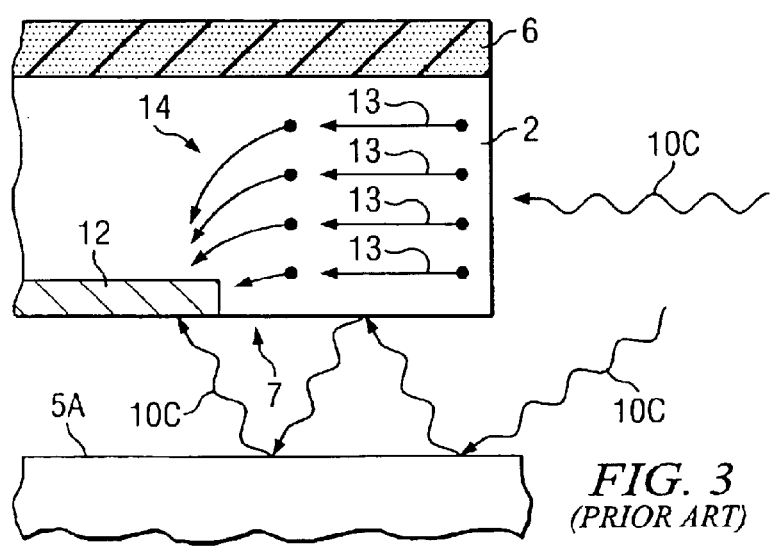
FIG. 3 is a section view of a portion of the WCSP chip generally indicating the flow of photon-induced currents within the WCSP chip as a result of ambient light.
Figure 4:
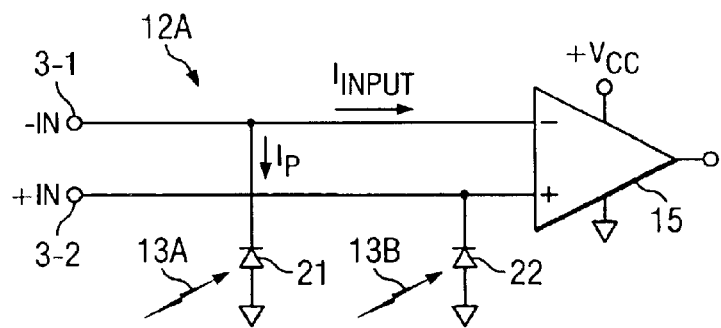
FIG. 4 is a schematic diagram useful in explaining the undesirable increase in the total input bias currents caused by collection of photon-induced currents by input protection diodes connected to the input terminals of an amplifier in the chip's active region.
Figure 5:
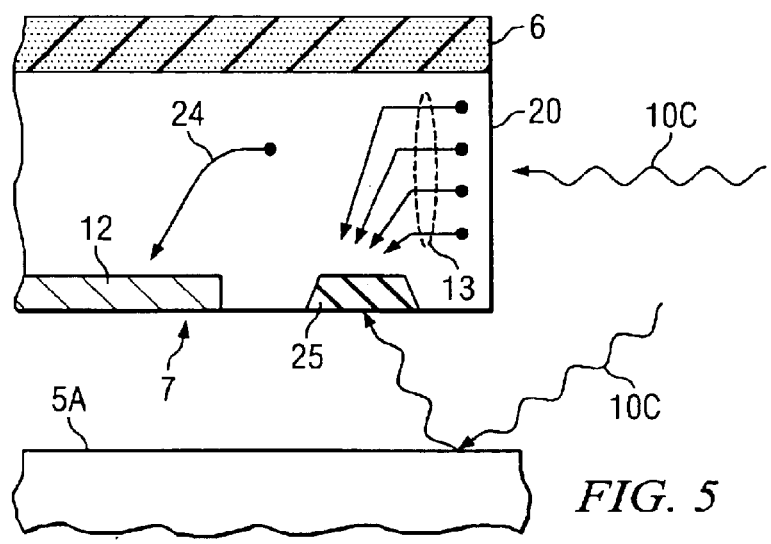
FIG. 5 is a partial section view showing flow of photon-induced currents in a WCSP chip having the barrier ring of the present invention.
Figure 7:
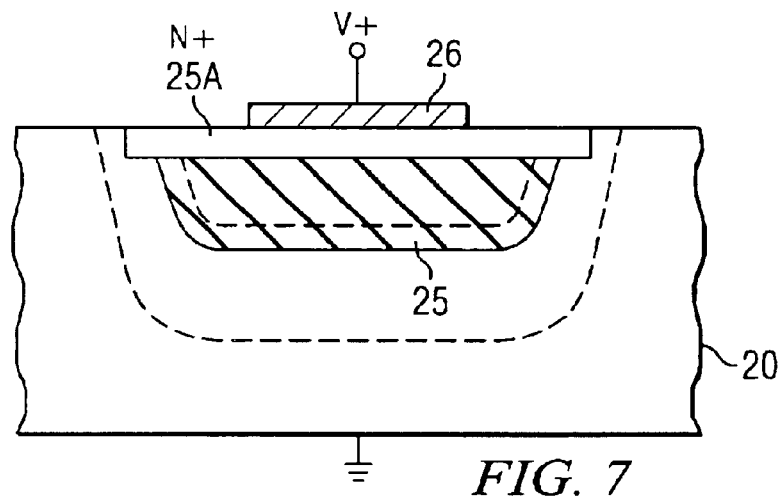
FIG. 7 is a section view illustrating a detailed structure of the barrier ring.

Referring to FIG. 5, a WCSP chip 20 according to the present invention is shown in a partial section view wherein direct or reflected ambient light 10C impinges on the exposed edges of chip 20 and generates photon-induced currents 13, as explained previously. As in FIGS. 1–3, a layer of light barrier material 6 is formed on the back surface of chip 20. However, an N-type reverse biased diode barrier region or ring 25 is formed in the top surface of the P-type substrate of chip 20 and surrounds the entire active area 12 in the top surface of the substrate 20 wherein active circuitry of WCSP chip 20 is formed. Barrier region or ring 25 is biased at V+volts as shown in FIG. 7, and P-type substrate 20 is biased at a lower voltage, for example ground. Alternatively, however, barrier region 25 does not need to form a complete closed loop. Barrier region 25 does not need to surround all of the active circuitry, and could, for example, just be adjacent to or surround part of the active circuitry and/or an input protection device. Also, barrier region 25 only needs to be reverse biased (or biased at 0 volts) by any suitable low impedance voltage source in order to cause barrier region 25 to collect the undesired photon induced currents and thereby prevent them from contributing to bias currents in the circuitry or otherwise causing circuit errors. However, biasing barrier region 25 at +VCC volts creates a depletion region that effectively enlarges the volume within which the photon induced currents are collected by barrier region 25.

Most of the photon-induced current 13 is collected by reverse biased diode barrier ring 25. The remaining small portion of the photon-induced current 13 that is not collected by barrier ring 25 is indicated by arrow 24, and is collected by circuitry in the active region 12. However, in a prototype embodiment of the present invention, photon-induced current portion 24 is only roughly 20% of the total induced photon current 13, and, therefore constitutes a minor contribution to the total input bias current of circuitry in active region 12.

Figure 6:
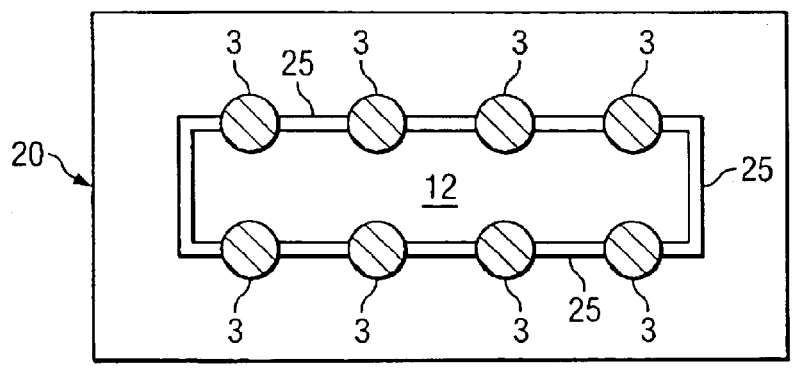
FIG. 6 is a plan view of the active surface of the WCSP chip of FIG. 5 illustrating a typical topography of the barrier ring.

FIG. 6 shows a plan view of the "top" surface of WCSP chip 20, wherein reverse biased N-type barrier ring 25 forms a continuous barrier completely surrounds active circuit region 12'. The solder bumps 13, generally being close to the edges of a chip, are located over portions of barrier ring 25.

A typical construction of N-type reverse biased diode barrier ring 25 is shown in the section view of FIG. 7, wherein an N-type region 25 forms a P—N junction with P-type substrate 20. Good electrical connection of the supply voltage V+via a metallization layer 26 is accomplished by providing a heavily doped N+ region 25A in the top surface of WCSP chip 20 on N-type ring region 25. (N+ region 25A can extend around the entire N type ring 25, or can it be a localized N+ electrical contact spot in region 25.) The dashed lines represent the depletion regions of the key and junction formed by P-type substrate 20 and N-type barrier region 25.

Figure 8:
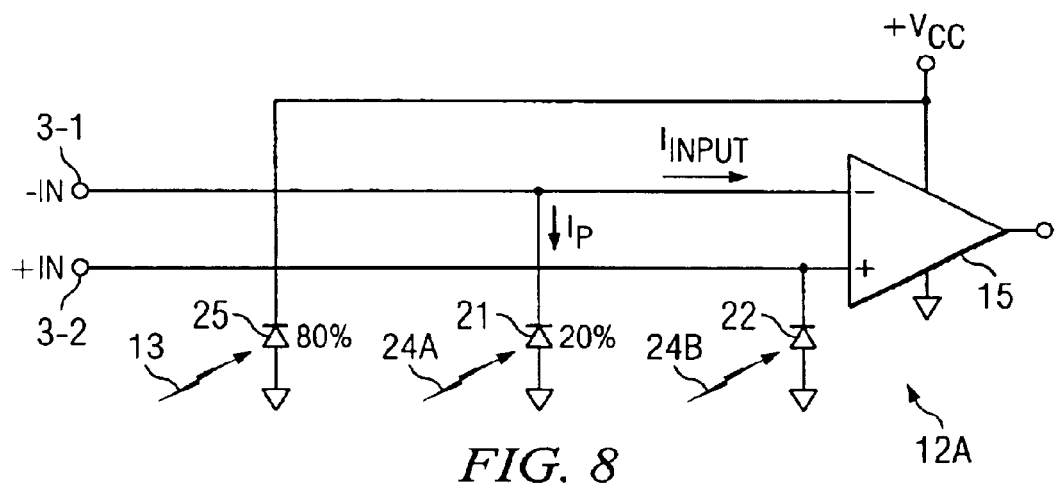
FIG. 8 is a schematic diagram useful in explaining how the barrier ring greatly decreases the total input bias current of an amplifier in the active region the WCSP chip of the present invention.

Referring to FIG. 8, operational amplifier 15 in active region 12 of WCSP chip 20 has its (−) input connected by an input conductor connected to a solder bump 3-1 and also to the N-type cathode region of input protection diode 21, the anode of which is formed by the P-type substrate 20. The (+) input of amplifier 15 is connected by an input conductor connected to a solder bump 3-2 and also to the N-type cathode region of an input protection diode 22, the anode of which is formed by the P-type substrate 20. Arrows 24A and 24B indicate the portions of the photon-induced current 13 shown in FIG. 5 which are able to reach the active region 12 and be collected by input protection diodes 21 and 22 therein. Therefore, the total input bias current flowing into each of terminals 3-1 and 3-2 is equal to the actual input bias current of the corresponding (−) or (+) input of amplifier 15 plus the corresponding reverse bias current and the photon induced current 24A or 24B of the corresponding input protection diode 21 or 22.

In accordance with the above described embodiment of the present invention as shown in FIGS. 5–8, barrier ring 25 is provided in the active surface of the WCSP chip along the outside edge of the active circuitry thereof to substantially reduce the amount of photon-generated substrate current in the substrate of chip 20 that reaches active circuitry within the active region 12. Barrier ring 25 functions to collect a major portion of the photon-induced substrate current, thereby preventing it from being collected by the input protection devices connected to the inputs of circuitry in the active region and being added to the actual input bias current of circuitry in the active region. In a prototype embodiment of the invention as shown in FIGS. 5–8 in which the width of the barrier region 25 is 6 microns, the total measured input bias current (supplied by a suitable bias source) through input terminals 3-1 and 3-2 was approximately 25 picoamperes, whereas in an otherwise identical device in which no barrier ring 25 was included, the measured total input bias current was approximately 150 picoamperes.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention. For example, if the conductivity types in the described embodiment are reversed (i.e., N-type regions are substituted for the described P-type regions and P-type regions are substituted for the described N-type regions), the resulting structure would is within the scope of the invention. In some cases it might be practical to form the N-type barrier ring in a region that is not the substrate of the chip, for example in a "tub" region in a dialectically isolated (DI) integrated circuit structure. We believe that in some cases substantially better performance can be achieved by making the barrier region wider substantially wider than the 6 microns in the above described prototype embodiment. Furthermore, placement of properly biased N barrier regions anywhere in integrated circuit will tend to prevent photon-induced currents from affecting operation of nearby integrated circuitry.

What is claimed is:

1. A semiconductor chip comprising:
   (a) a semiconductor substrate of a first conductivity type having an active surface having therein an interior active region containing integrated circuitry;
   (b) a peripheral barrier region of a second conductivity type disposed in the semiconductor substrate adjacent to the active region;
   (c) a voltage conductor for applying a non-foreword biasing voltage to the barrier region;
   (d) a plurality of solder bumps disposed on the active surface and electrically coupled to various conductors of integrated circuitry in the active region, respectively, the solder bumps being adapted for attachment to a plurality of conductive pads, respectively, of a mounting substrate;
   (e) wherein a substantial amount of photon-induced current caused by ambient light impinging on the exposed edges and/or surfaces of the semiconductor substrate is collected by the barrier region and substantially less of the photon-induced current is collected by any of the integrated circuitry.
2. The semiconductor chip of claim 1 wherein the barrier region surrounds the interior active region.

3. The semiconductor chip of claim 1 wherein the voltage conductor applies a reverse bias voltage to the barrier region.
4. The semiconductor chip of claim 1 wherein the voltage conductor applies a zero bias voltage to the barrier region.
5. The semiconductor chip of claim 1 including a layer of light barrier material on a back surface of the semiconductor substrate.
6. A semiconductor chip comprising:
   (a) a P-type semiconductor substrate having an active surface having therein an interior active region containing integrated circuitry and a back surface having a light barrier coating thereon;
   (b) a peripheral N-type barrier region disposed in the semiconductor substrate surrounding the active region;
   (c) a supply voltage conductor for applying a reverse bias voltage to the N-type barrier region;
   (d) a plurality of solder bumps disposed on the active surface and electrically coupled to various conductors of integrated circuitry in the active region, respectively, the solder bumps being adapted for attachment to a plurality of conductive pads, respectively, of a mounting substrate;
   (e) wherein a substantial amount of photon-induced current caused by ambient light impinging on the exposed edges and/or surfaces of the semiconductor substrate is collected by the N-type barrier region and substantially less of the photon-induced current is collected by any of the integrated circuitry.
7. The semiconductor chip of claim 2 wherein the barrier region surrounds the interior active region.
8. The semiconductor chip of claim 2 wherein the integrated circuitry includes an amplifier having a first input connected to both the cathode of the first input protection diode and a first solder bump and a second input connected to both the cathode of the second input protection diode and a second solder bump, wherein an total input bias current of the amplifier includes relatively little photon-induced current.
9. The semiconductor chip of claim 2 wherein the supply voltage conductor is coupled to the N-type barrier region by means of an N+ contact region on the N-type barrier region.
10. The semiconductor chip of claim 2 wherein at least one of the solder bumps overlies the barrier region.
11. A semiconductor chip comprising:
   (a) a P-type semiconductor substrate having an active surface having therein an interior active region containing integrated circuitry and a back surface having a light barrier coating thereon;
   (b) a peripheral N-type barrier region disposed in the semiconductor substrate surrounding the active region;
   (c) a supply voltage conductor for applying a reverse bias voltage to the N-type barrier region;
   (d) a plurality of solder bumps disposed on the active surface and electrically coupled to various conductors of integrated circuitry in the active region, respectively, the solder bumps being adapted for attachment to conductive pads, respectively;
   (e) a mounting substrate having thereon a plurality of conductive pads to which the solder bumps are physically and electrically connected, respectively;
   (f) wherein a substantial amount of photon-induced current caused by ambient light impinging on the exposed edges and/or surfaces of the semiconductor substrate is collected by the N-type barrier region and substantially less of the photon-induced current is collected by any of the integrated circuitry.

12. A method of reducing the amount of photon-induced current in a semiconductor chip, comprising:

(a) forming a peripheral N-type region in a P-type substrate of the chip, the N-type region adjacent to an active region including integrated circuitry on a first surface of the substrate and reverse biasing a PN junction between the N-type region and the P-type substrate;

(b) providing a plurality of solder bumps on the active surface and electrically coupling of solder bumps to various conductors, respectively, of the integrated circuitry in the active region, the solder bumps being adapted for attachment to conductive pads of a mounting substrate, respectively; and (c) collecting nearly all photon-induced current caused by ambient light impinging on the exposed edges of the semiconductor substrate by means of the N-type barrier region so that relatively little of the photon-induced current is available to be collected by any of the integrated circuitry.

13. The method of claim 12 wherein step (a) includes forming the peripheral N-type region in a P-type substrate of the chip, the N-type region to surround the active region.

14. The method of claim 12 including mounting the chip on a mounting substrate by physically and electrically attaching the solder bumps to corresponding conductive metal pads on a surface of the mounting substrate.

15. A method of reducing the amount of photon-induced current in a semiconductor chip, comprising:

(a) forming a peripheral N-type region in a P-type substrate of the chip, the N-type region surrounding an active region including integrated circuitry on a first surface of the substrate and reverse biasing a PN junction between the N-type region and the P-type substrate;

(b) providing a plurality of solder bumps on the active surface and electrically coupling of solder bumps to various conductors, respectively, of the integrated circuitry in the active region;

(c) mounting the chip on a mounting substrate by physically and electrically attaching the solder bumps to corresponding conductive metal pads on a surface of the mounting substrate;

(d) collecting nearly all photon-induced current caused by ambient light impinging on the exposed edges of the semiconductor substrate by means of the N-type barrier region so that relatively little of the photon-induced current is available to be collected by any of the integrated circuitry.

16. A semiconductor device structure for reducing the amount of photon-induced current in a semiconductor chip, comprising:

(a) peripheral barrier region means in a P-type substrate of the chip, adjacent to an active region including integrated circuitry on a first surface of the substrate, for collecting nearly all photon-induced current caused by ambient light impinging on an exposed edge of the semiconductor substrate so that relatively little of the photon-induced current is available to be collected by the integrated circuitry;

(b) means for biasing a PN junction formed by the N-type region and the P-type substrate to a reverse bias or zero bias value; and (c) a plurality of solder bumps on the active surface and electrically coupled to various conductors, respectively, of the integrated circuitry in the active region, the solder bumps being adapted for attachment to conductive pads, respectively.

17. The semiconductor device structure of claim 16 including a mounting substrate and the solder bumps electrically physically connected to corresponding conductive metal pads on a surface of the mounting substrate.

* * * * *